(12) United States Patent
Tatsuura et al.

(10) Patent No.: US 6,923,892 B2
(45) Date of Patent: Aug. 2, 2005

(54) METHOD FOR ELECTRODEPOSITED FILM FORMATION, METHOD FOR ELECTRODE FORMATION, AND APPARATUS FOR ELECTRODEPOSITED FILM FORMATION

(75) Inventors: Satoshi Tatsuura, Nakai-machi (JP); Yasuhiro Sato, Nakai-machi (JP); Minquan Tian, Nakai-machi (JP); Lyong Sun Pu, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 184 days.

(21) Appl. No.: 10/082,228

(22) Filed: Feb. 26, 2002

(65) Prior Publication Data

US 2002/0096433 A1 Jul. 25, 2002

Related U.S. Application Data

(62) Division of application No. 09/571,864, filed on May 16, 2000, now Pat. No. 6,365,027.

(30) Foreign Application Priority Data

May 17, 1999 (JP) ............................................ 11-136117

(51) Int. Cl.$^7$ ............................ C25D 17/00; B05C 5/00
(52) U.S. Cl. ................................. 204/224 R; 118/620
(58) Field of Search ........................ 204/224 R; 118/620

(56) References Cited

U.S. PATENT DOCUMENTS 4,217,183 A * 8/1980 Melcher et al. ................ 205/92
4,349,583 A    9/1982 Kulynych et al. .......... 427/53.1
5,296,960 A * 3/1994 Ellingson et al. ........... 359/330
5,426,686 A * 6/1995 Rentzepis et al. ............. 378/34

OTHER PUBLICATIONS

Gutfield et al., *Electrochemical microfabrication by laser-enhanced photothermal processes*, IBM J. Res. Develop., vol. 42, No. 5, 1998, pp. 639–652., no month.

Chichkov etal., *Fetosecond, picosecond and nanosecond laser ablation of solids*, Applied Physics A–63, 1996, pp. 109–115., no month.

Obara et al., *Laser Engineering Optics*, Kyoritsu Shuppan, 1998, pp. 130–133., no month.

Gutfeld et al., "Electrochemical Microfabrication by Laser-Enhanced Photothermal Processes," J. Res. Develop., vol. 42, No. 5, pp. 639–652, Sep. 1998.

* cited by examiner

*Primary Examiner*—Edna Wong
(74) *Attorney, Agent, or Firm*—Oliff & Berridge, PLC

(57) ABSTRACT

A method permitting less energy consumption and efficient formation of high quality electrodes is provided. An electrode is formed as an electrodeposited film by irradiating the surface of an object to be treated, the surface at least permitting generation of charged particles when irradiated with a laser beam, with a fentosecond laser beam and metal-plating the surface of a substrate using hot electrons generated by this laser irradiation.

17 Claims, 12 Drawing Sheets

T1: IRRADIATION WITH SAPPHIRE LASER BEAM
($2\ W/cm^2$, -600mV, 150s)

FIG.9

|  | Cu | Ni | O | C |
|---|---|---|---|---|
| fs LASER INCIDENT ON FRONT SIDE | 12 | 12 | 37 | 39 |
| fs LASER INCIDENT ON BACK SIDE | 19 | 0 | 29 | 52 |

(atomic%)

NOTE 1) COMPOSITION MAY INVOLVE ERRORS OF UP TO ABOUT 30%.
NOTE 2) ANALYSIS DEPTH OF XPS IS A FEW nm.
NOTE 3) MOST PART OF DETECTED C IS ATTRIBUTABLE TO HYDROCARBONS, WHICH CONTAMINATE SURFACE.

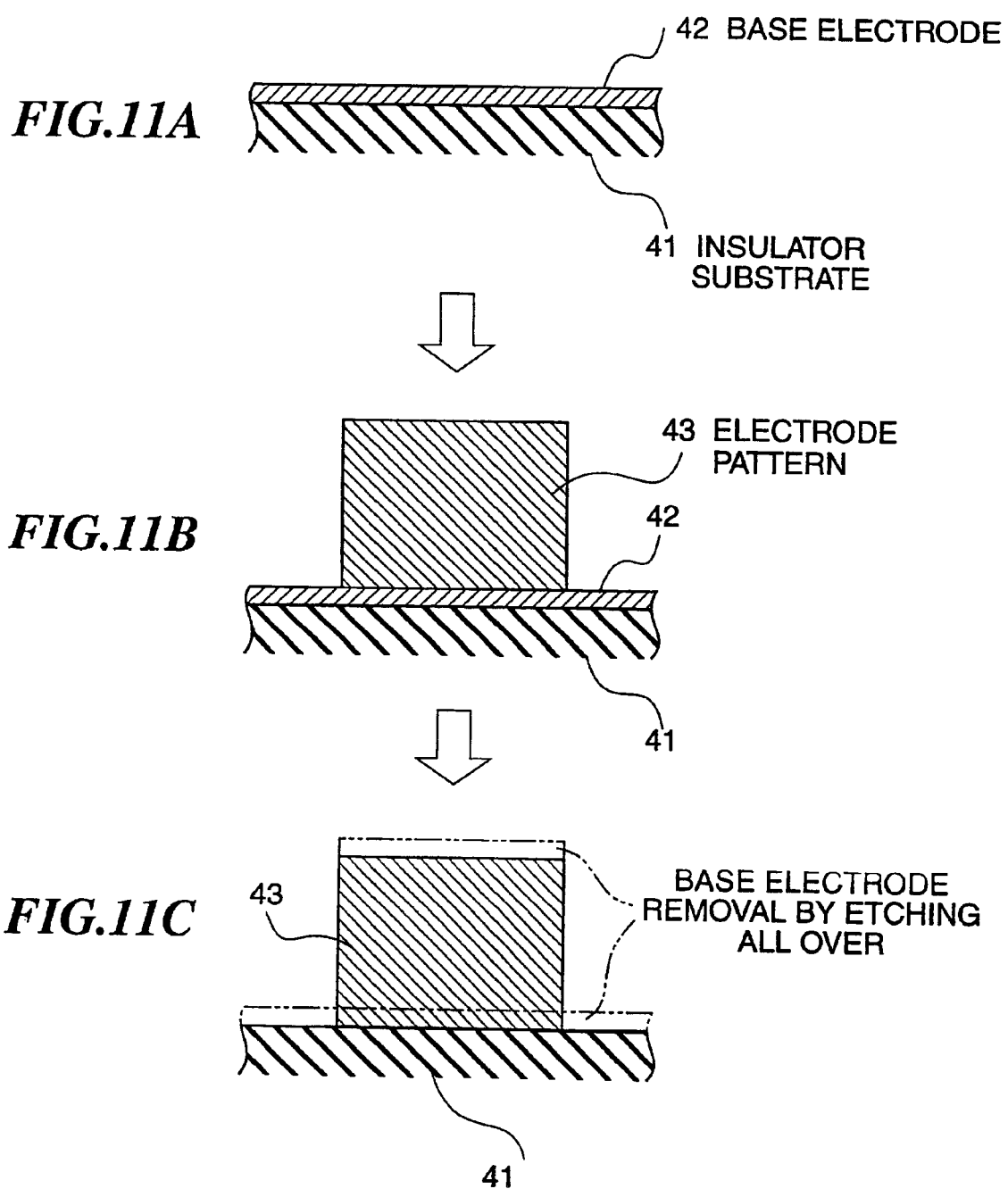

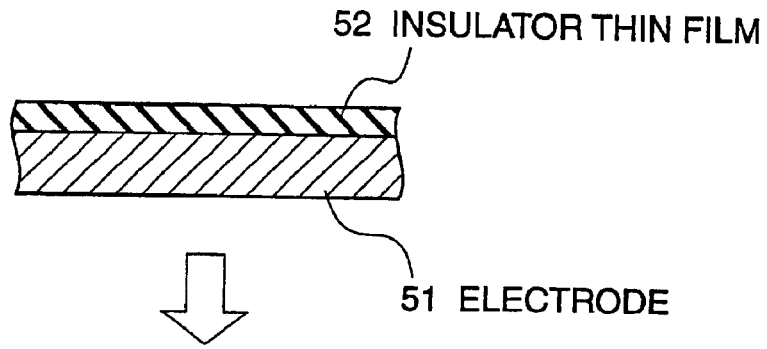
FIG.12A
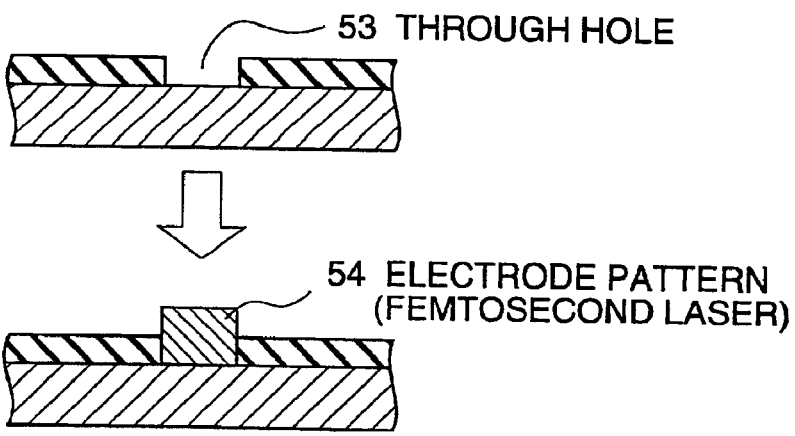
FIG.12B
FIG.12C
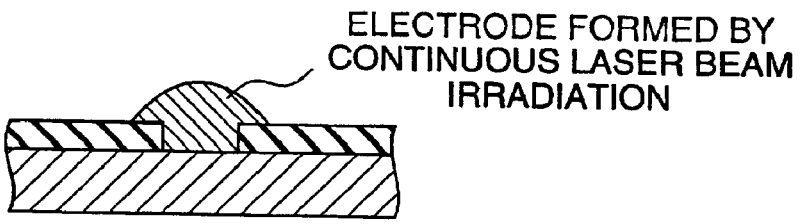
FIG.12D

PRIOR ART

US 6,923,892 B2

METHOD FOR ELECTRODEPOSITED FILM FORMATION, METHOD FOR ELECTRODE FORMATION, AND APPARATUS FOR ELECTRODEPOSITED FILM FORMATION

This is a Division of application Ser. No. 09/571,864 filed May 16, 2000, which issued as U.S. Pat. No. 6,365,027 on Apr. 2, 2002. The entire disclosure of the prior application is hereby incorporated by reference herein in its entirety.

BACKGROUND OF THE INVENTION

1. Field of the Invention

This invention relates to methods for forming an electrodeposited film or an electrode over the surface of an object to be treated using an ultra-short pulse laser.

2. Description of the Related Art

Attempted applications of laser to electrode formation technology can be broadly classified into plating and etching.

The basic principle of application to plating is that an object to be plated soaked in a plating solution is irradiated with a laser beam and the resultant thermo-electromotive force causes part of the object to be plated (see, for instance, Reference 1: specification of the U.S. Pat. No. 4,349,583, and Reference 2: *IBMJ. Res. Develop.*, Vol. 42, No.5, September 1998).

According to this plating method, a bias voltage may or may not be applied from an external circuit. Application of a bias voltage would result in electrolytic plating, which allows partial plating as the laser-irradiated part is plated faster than the non-irradiated part. Non-application of a bias voltage would result in non-electrolytic plating. In this case, the laser-irradiated part functions as the active electrode and the non-irradiated part, as the opposite electrode, and the plating of the irradiated part and the dissolution (etching) of the non-irradiated part take place at the same time.

The above-cited specification of the U.S. Pat. No. 4,349,583, for example, discloses a case of non-electrolytic plating. Referring to this prior art, FIG. 13 illustrates a case in which a less noble metal (LNM) substrate disposed in a plating bath is irradiated with a laser beam LB and a more noble metal (MNM) electrode is formed by metal-plating over the LNM substrate, while FIG. 14 shows an instance in which an LNM film over a glass substrate G is irradiated with the laser beam LB and an MNM electrode is formed by metal-plating over the LNM film.

Since FIG. 13 and FIG. 14 illustrate cases non-electrolytic plating involving no application of a bias voltage, in both cases LNM portions around the MNM part are etched simultaneously with the formation of metal-plating as an MNM electrode (see the ADR portion in FIG. 13 and the L portion in FIG. 14).

As applications of the above-described plating technique using laser irradiation, maskless patterning and electrode repairing are proposed.

Incidentally, the laser so far considered for application to plating is either a continuous beam (in the case of the U.S. patent of Reference 1), such as an argon laser, or a pulse laser, whose time width is tens of picoseconds or more, such as a YAG laser.

Since these lasers, in order to obtain a sufficient thermo-electromotive force, require a high output of $10^2$ to $10^6$ W/cm$^2$ in the intensity of irradiating light, plating over a large area needs either a high output laser or long duration of irradiation.

There is another problem in the conventional application to plating that, since it is a thermal process, thermal diffusion gives rise to overhangs on the edges of plating as illustrated in FIG. 13 and FIG. 14.

Furthermore, for electrode formation, in many cases a hole is first bored by etching followed by electrode formation (plating) in the bored part, but since no sharply edged hole can be bored by similar thermal diffusion with a continuous beam and a pulse of tens of picoseconds in time width, different lasers need to be used for etching and electrode formation.

In view of these problems, this invention is intended to provide methods which permit formation of efficient electrodes consuming less energy and excelling in quality.

SUMMARY OF THE INVENTION

To solve the above-noted problems, according to one aspect of this invention, there is provided a method for electrodeposited film formation by which a surface of an object to be treated, the surface at least permitting generation of charged particles when irradiated with a laser beam, is irradiated with a pulse laser whose pulse width is less than a picosecond; almost solely electrons are excited on the surface of the object to be treated to generate a state of non-equilibrium in either temperature or energy between the electrons and a grid; and an electrodeposited film is formed on the surface of the object to be treated using the electrons excited in that state of non-equilibrium.

According to another aspect of the invention, there is provided a method for electrodeposited film formation by which a surface of an object to be treated, the surface at least permitting generation of charged particles when irradiated with a laser beam, is irradiated with a pulse laser whose pulse width is less than a picosecond; and an electrodeposited film is formed on the laser-irradiated part of the surface of the object to be treated using hot electrons generated by this laser irradiation.

According to still another aspect of the invention, there is provided a method for electrodeposited film formation, as stated in the foregoing paragraph, wherein the object to be treated is a substrate, and an electrode is formed as the electrodeposited film by metal-plating the surface of the substrate using a pulse laser whose pulse width is less than a picosecond.

According to yet another aspect of the invention, there is provided a method for electrodeposited film formation, as stated in the foregoing paragraph, wherein the electrodeposited film is formed by applying a bias voltage so as to inject electrons into the surface of the object to be treated when carrying out the metal-plating with the pulse laser whose pulse width is less than a picosecond.

BRIEF DESCRIPTION OF THE DRAWINGS

Preferred embodiments of this invention will be described in detail with reference to accompanying drawings, wherein:

FIG. 9 illustrates the results of surface analysis of the laser-irradiated part when the laser beam is incident on the front side and when it is on the back side.

FIGS. 11A to 11C illustrate an example of electrode formation process in preferred embodiments of the present invention.

FIGS. 12A to 12D illustrate an example of formation process of a three-dimensional electrode circuit in the preferred embodiments of the present invention.

Actions

As stated above, this invention uses a pulse laser having a pulse width of less than a picosecond (hereinafter referred to as a femtosecond laser). When an object to be treated with this femtosecond laser, a state of non-equilibrium between the electrons and a grid in either temperature or energy can be realized particularly in a surface part of the object to be treated, and only electrons can be heated to high temperature without inviting generation of phonons (grid vibration= heat). In this state of non-equilibrium, the whole luminous energy can be regarded as being given to the electrons.

According to the invention, hot electrons generated in this manner are taken out of the surface of the object to be treated, and the hot electrons so taken out are used for forming an electrodeposited film by, for instance, metal-plating. Therefore, the invention allows plating without relying on thermo-electromotive force.

Since no grid vibration (i.e. heat) arises then, and accordingly the object to be treated itself is not heated, resulting in a reduced thermo-electromotive force, overhangs on the edges of plating, which are inevitable by the conventional method of partial plating using the thermo-electromotive force generated by laser irradiation, can be prevented, and an improved aspect ratio at the end part of plating can be expected.

Further, where a pulse laser whose pulse width is in the order of nanoseconds, electrons and the grid reach a thermal equilibrium during irradiation with the pulse laser, resulting in partial consumption of luminous energy by the grid vibration and a consequent drop in the efficiency of energy utilization. According to this invention, by contrast, as plating is formed by hot electrons taken out before the above-noted thermal relaxation occurs, the energy of the laser pulse is efficiently utilized for plate formation, allowing realization with a low output laser.

DETAILED DESCRIPTION OF THE PREFERRED EMBODIMENTS

A preferred mode of carrying out this invention will be described below with reference to a case in which an electrode is formed over a substrate by electrolytic plating.

Figure 1A:
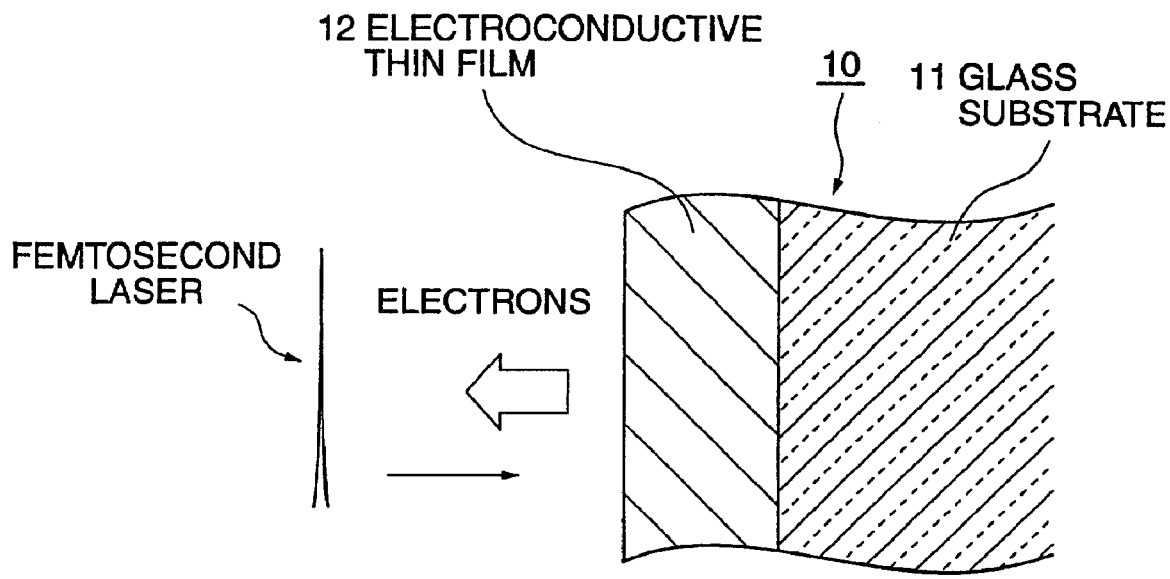
FIGS. 1A to 1B illustrate the principle of a method for electrode formation according to the invention.
Figure 1B:
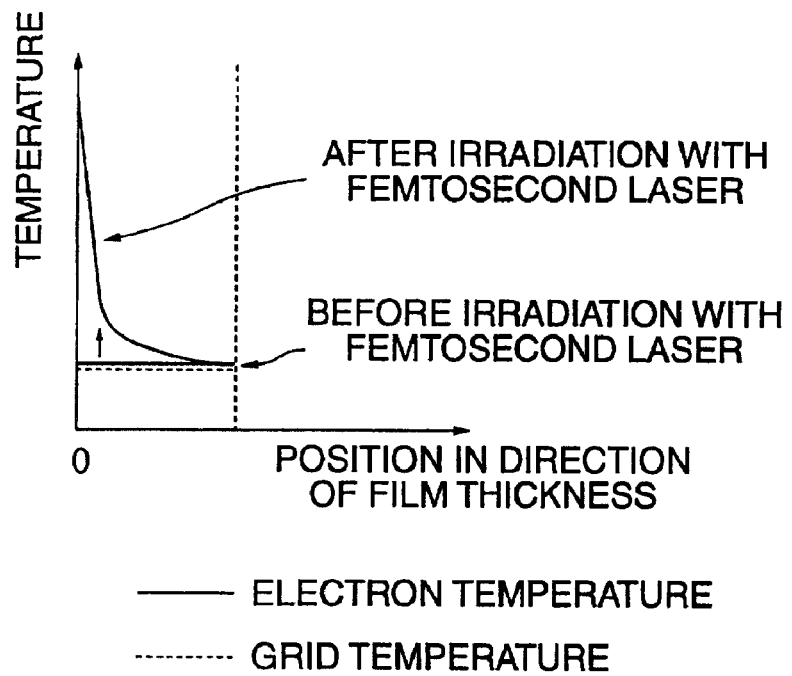

In this mode of carrying out the invention, an object to be treated 10 formed of a glass substrate 11 over which an electroconductive thin film 12 is formed by, for instance, vapor deposition as illustrated in FIGS. 1A to 1B is soaked in an electrolyte solution and, in a state in which a bias voltage is applied by an electrochemical method so that an electric current flow at least to the electroconductive thin film 12, the electroconductive thin film 12 is irradiated with a femtosecond laser.

Then, as electrons and a grid take at least a few picoseconds to reach a thermal equilibrium, at least the vicinities of the surface of the electroconductive thin film 12 are in a state of non-equilibrium, and hot electrons are generated therefrom. These hot electrons are utilized for plating formation beyond a Schottky barrier, formed on their interface with the electrolyte solution, by the application of a bias voltage. As a result, the metal in the electrolyte solution, such as Pt or Zn, is plated over the femtosecond laser-irradiated part of the surface of the electroconductive thin film 12, where the hot electrons have been generated.

Since the energy of the femtosecond laser then is wholly given to the electrons and does not invite the generation of unnecessary grid vibration, i.e., heat, no temperature gradient, which would arise where plating is formed by a thermo-electromotive force, arises on the edges of the plating, where overhangs which would be inevitable in a conventional process are suppressed, resulting in plating with a high aspect ratio.

An example of plating apparatus to which a method for electrode formation, embodied as described above, will now be explained with reference to FIG. 3. As will be stated later, this apparatus illustrated in FIG. 3 is also used for verification of this invention and for confirmation of its advantages.

Figure 3:
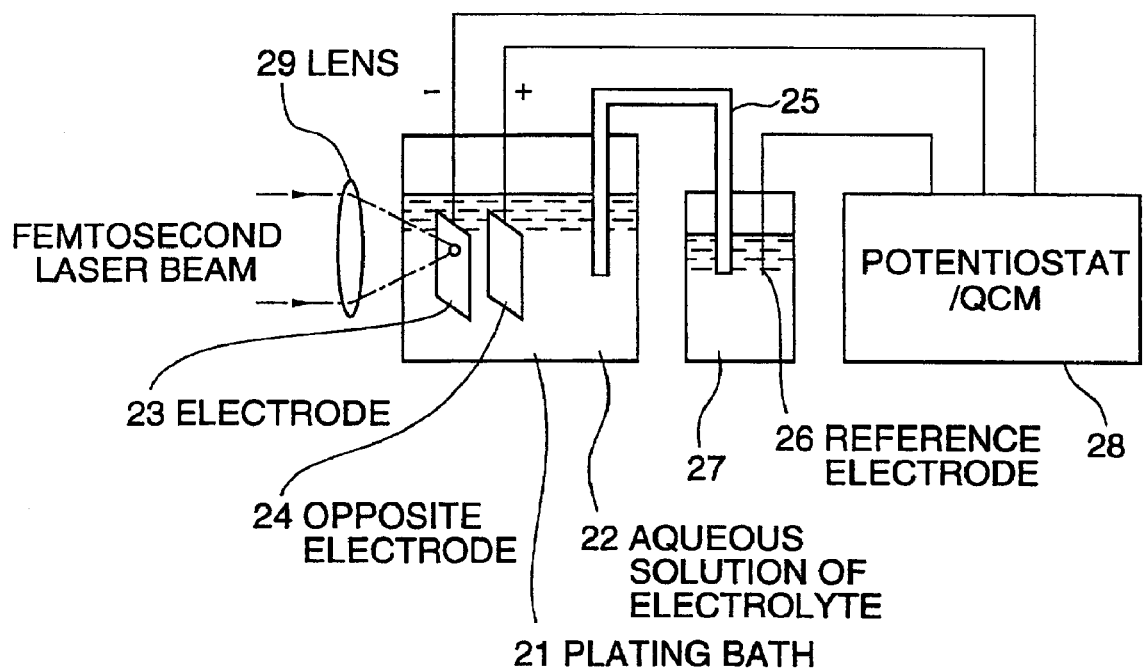
FIG. 3 illustrates an example of apparatus to which a method for electrode formation according to the invention can be applied.

In FIG. 3, reference numeral 21 denotes a plating bath, containing an electrolyte solution 22. In the electrolyte solution 22 contained in this plating bath 21 is soaked an electrode 23. This electrolyte solution 22 is an aqueous solution of the metal with which the electrode is to be plated. The concentration of this aqueous solution of the metal is, for instance, 2 to 18% wt.

This electrode 23 is matched by, for instance, the electroconductive thin film 12 vapor-deposited over the glass substrate 11 of the object to be treated 10. In the electrolyte solution 22 of the plating bath 21 is soaked one of the legs of an inverted U-shaped salt bridge 25 in addition to an opposite electrode 24 to the electrode 23 to be plated. The other leg of the salt bridge 25 is soaked in a reference bath 27, in which a reference electrode 26 is also soaked.

A potentiostat/QCM 28 applies a bias voltage between the electrode 23 and the opposite electrode 24 by an electrochemical method and, at the same time, measures variations in amperage in the presence or absence of a laser and in weight due to plating formation over the electrode 23. Variations in electrode weight are determined as variations in the resonance frequency of a quartz oscillator fitted to the electrode 23.

The potentiostat/QCM 28 effects control so as to keep constant the bias voltage applied between the electrode 23 and the reference electrode 26 by causing the voltages of the electrode 23 and of the opposite electrode 24 to remain constant.

Although Au, Cu, Pt or Zn is used for the electrode 23 in the embodiments of the invention to be described afterwards, the usable metals are not limited to them, and they can as well be chosen out of Cd, CrSnAu, AgRh, Ru, Pb, TiPd, Co, B, Ge, Al, In, Ir, Mo, W, V, Ta, Ni, Sn and their alloys according to the purpose to be achieved. Also, an ITO film or an electroconductive organic thin film may be utilized.

For the electrolyte solution 22, though an aqueous solution containing Cu, Pt, Zn or Ni is used in the embodiments to be described below, an aqueous solution containing one of Cd, Cr, Sn, Au, Ag, Rh, Ru, Pb, Ti, Pd, Co, B, Ge, Al, In, Ir, Mo, W, V and Ta can as well be used.

Further, in this embodiment, Pt or platinum black is used for the opposite electrode 24 and saturated calomel is used for the reference electrode 26, and they, together with the electrode 23, constitute a triple electrode configuration.

The femtosecond laser is condensed by a lens 29 on, and irradiates, the electrode 23. The femtosecond laser in this case is a mode-locked titanium sapphire amplified by a regenerative amplifier. In this example, the wavelength of this femtosecond laser is 780 nm, the pulse width is not more than 500 femtoseconds in half width, approximately 200 femtoseconds in this example, and the repetition frequency is 1 kHz. The intensity of the irradiating beam is 1 to 30 $W/cm^2$, 100 to 420 mW in output terms or tens of $GW/cm^2$ in field intensity.

First, the principle of plating formation in this embodiment will be described in further detail.

FIGS. 1A to 1B illustrate the principle of taking out hot electrons with a femtosecond laser fs whose pulse width is less than a picosecond.

In FIG. 1A, the object to be treated 10, which is to undergo plating, includes the glass substrate 11 over whose surface is vapor-deposited the electroconductive thin film 12. As stated above, this object to be treated 10 is soaked in the electrolyte solution 22.

As shown in FIG. 1A, when the surface of the electroconductive thin film 12 of the object to be treated 10 is irradiated with a femtosecond laser, as the femtosecond laser has a powerful electric field in the order of tens of $GW/cm^2$, the electron temperature in the electroconductive thin film 12 is raised steeply. Then, as the electrons and the grid take at least a few picoseconds to reach a thermal equilibrium, the grid temperature within the electroconductive thin film 12 does not rise during irradiation with the femtosecond pulse. Therefore, the electron temperature and the grid temperature in the electroconductive thin film 12 remain out of equilibrium during irradiation with this femtosecond pulse.

Thus, before irradiation with the femtosecond laser, the electron temperature represented by a solid line and the grid temperature represented by a dotted line in FIG. 1B are equal because they are in an equilibrium with each other, but once irradiation with the femtosecond laser begins, the electron temperature steeply rises, the temperature rise being particularly conspicuous toward the surface of the electroconductive thin film 12. The grid temperature does not rise during irradiation with the femtosecond laser, resulting in a non-equilibrium as shown in FIG. 1B.

In this state, since the whole luminous energy is given to the electrons and no unnecessary grid vibration (=heat) is invited, the electrons are efficiently excited. In this mode of carrying out the invention, by applying a bias voltage to the excited hot electrons, the Schottky barrier formed on the interface with the electrolyte solution is surpassed, and the hot electrons that are taken out are utilized for plating.

Here, the bias voltage that is applied between the electroconductive thin film 12 of the object to be treated 10 and the opposite electrode 24 is set to be in itself not high enough to invite formation an electrodeposited film over the object to be treated but high enough to surpass the Schottky barrier formed on the interface with the aqueous solution of electrolyte only when augmented with the excitation of electrons by irradiation with the femtosecond laser. Or, where electrons are excited sufficiently for the Schottky barrier to be surpassed merely by irradiation with the femtosecond laser, application of a bias voltage is dispensable, though its application would facilitate formation of the electrodeposited film.

Figure 2A:
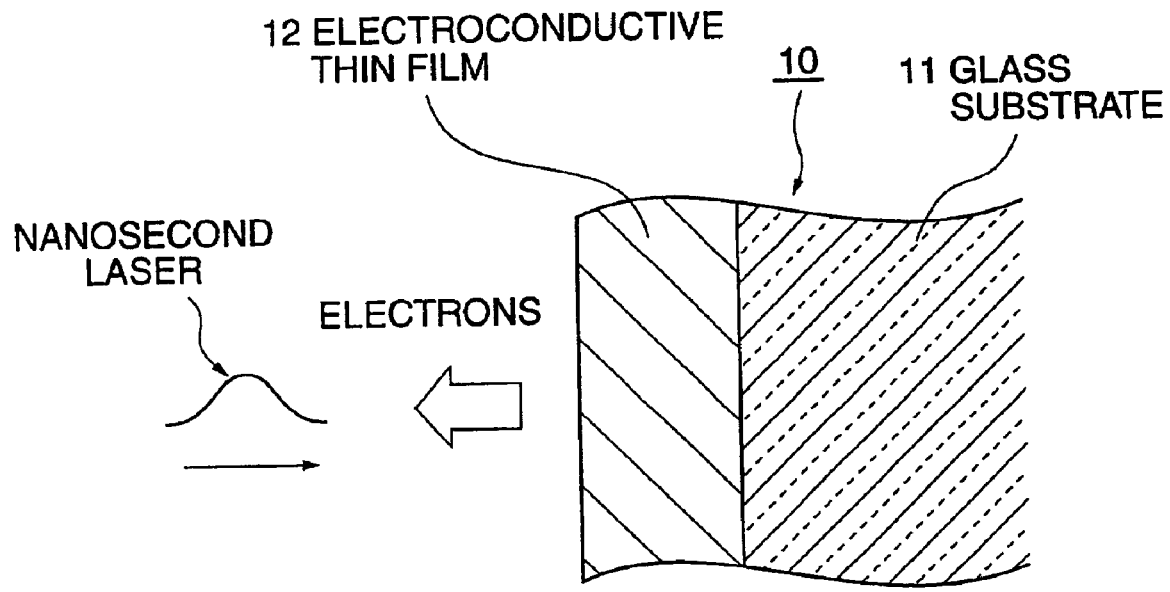
FIGS. 2A to 2B illustrate a method for electrode formation using a nanosecond laser.
Figure 2B:
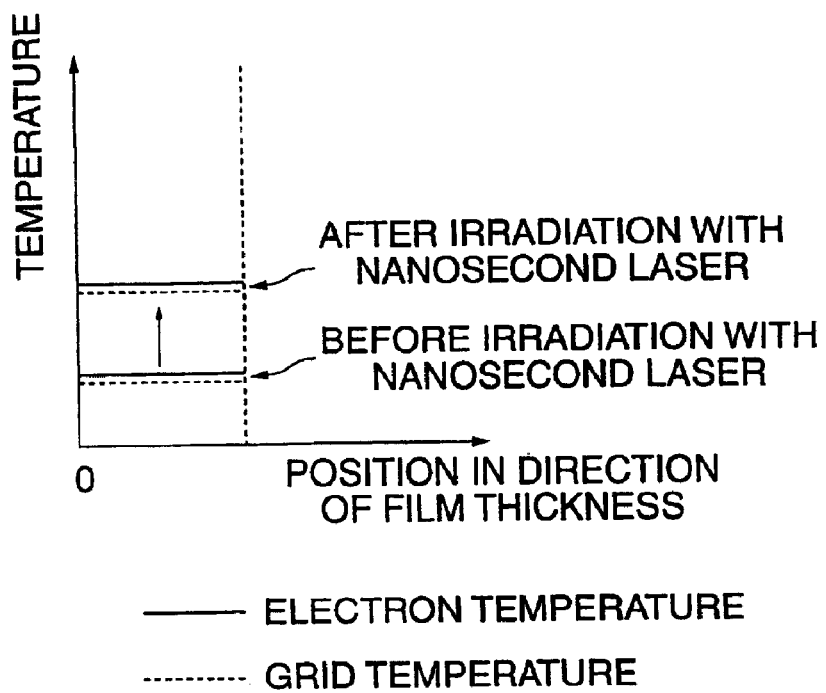

Next, for the sake of comparison, a case in which a pulse laser beam whose pulse width is approximately a nanosecond (hereinafter to be referred to as a nanosecond laser) will be described with reference to FIGS. 2A to 2B.

Where the surface of the electroconductive thin film 12 of the same object to be treated 10 as the aforementioned is irradiated with a nanosecond laser, as the electrons and the grid reach a thermal equilibrium during irradiation with this nanosecond laser, the electrons and the grid are equal in temperature whether before or after irradiation with the nanosecond laser as shown in FIG. 2A, except that the temperatures of both the electrons and the grid are higher after irradiation with the nanosecond laser than before it.

Thus, where the object is irradiated with a nanosecond laser, the efficiency of energy utilization drops because part of the luminous energy is consumed by grid vibration. As a result, when the electrons taken out are used for plating or the like, greater energy is expected to be required than when irradiation is accomplished with a femtosecond laser.

Where a nanosecond laser is used for plating, since electrons generated by a thermo-electromotive force are used, a temperature gradient due to thermal diffusion or the like arises, inevitably inviting overhangs on the edges of the plating. By contrast, as plating is formed by hot electrons generated by irradiation with a femtosecond laser in this mode of implementation, less heat is generated and accordingly overhangs on the edges of the plating due to thermal diffusion can be suppressed.

Furthermore, as will be stated afterwards, the method in this mode of implementation can be combined with etching utilizing a femtosecond laser to allow three-dimensional machining of an electrode.

Next, the results of verification of this embodiment, and of the confirmation of its advantages, will be described. For embodiments as experiments for the verification and confirmation, the apparatus illustrated in FIG. 3 was used as the measuring instrumentation for the purpose.

For the femtosecond laser beam in the following examples, a laser of 780 nm in wavelength, approximately 200 femtoseconds in pulse width and 1 kHz in repetition frequency (hereinafter to be referred to as an fs laser) was used. Further, for comparative reference, similar experiments were carried out using a continuous argon laser beam (hereinafter referred to as a cw laser) and a non-mode-locked titanium sapphire laser beam (hereinafter referred to as an ns laser) of 350 nanoseconds in pulse width, 780 nm in wavelength and 1 kHz in repetition frequency, and the results were compared.

(Embodiment 1)

Figure 4:
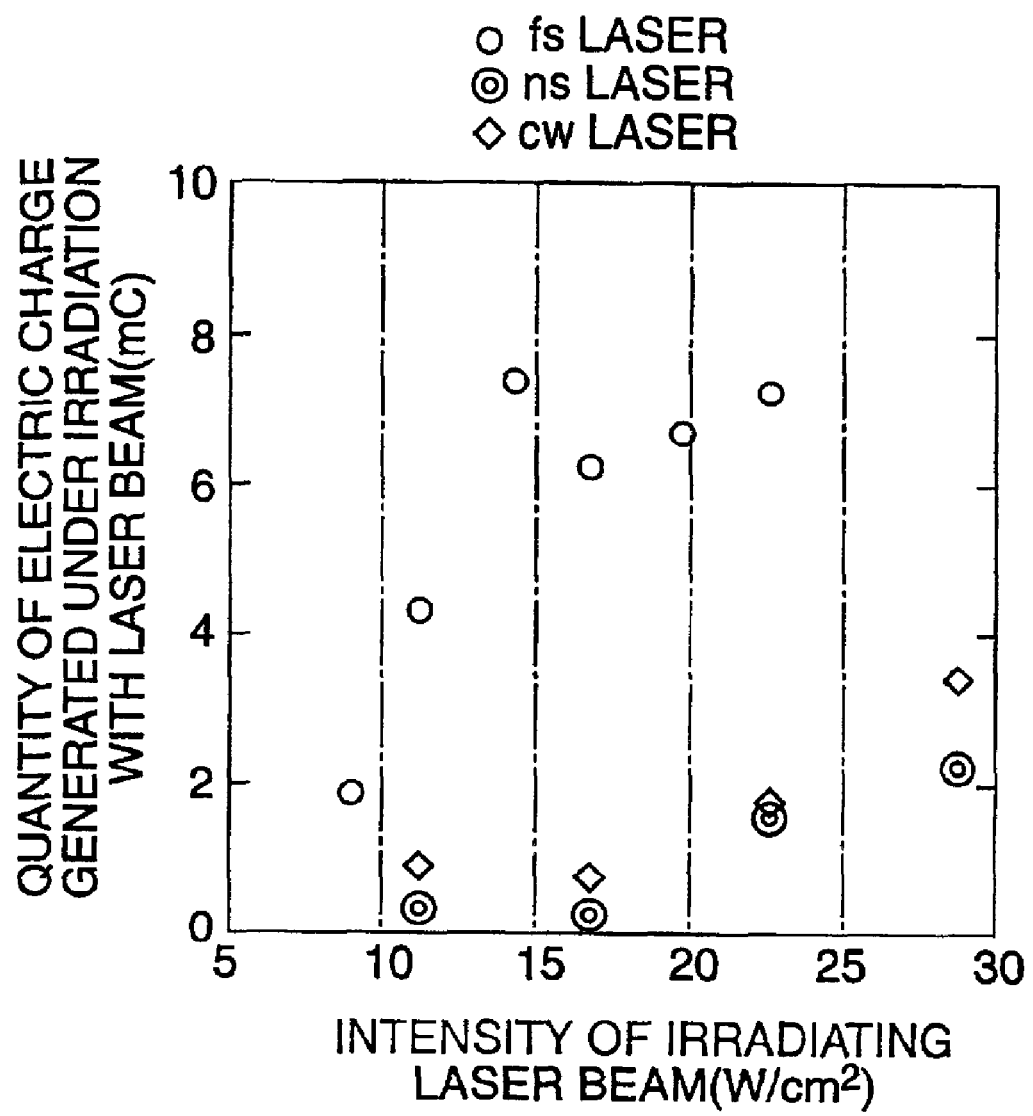
FIG. 4 illustrates an example of the dependence of the quantity of generated electric charge on the luminous intensity of the irradiating beam in the case of an aqueous solution of Pt.
Figure 5:
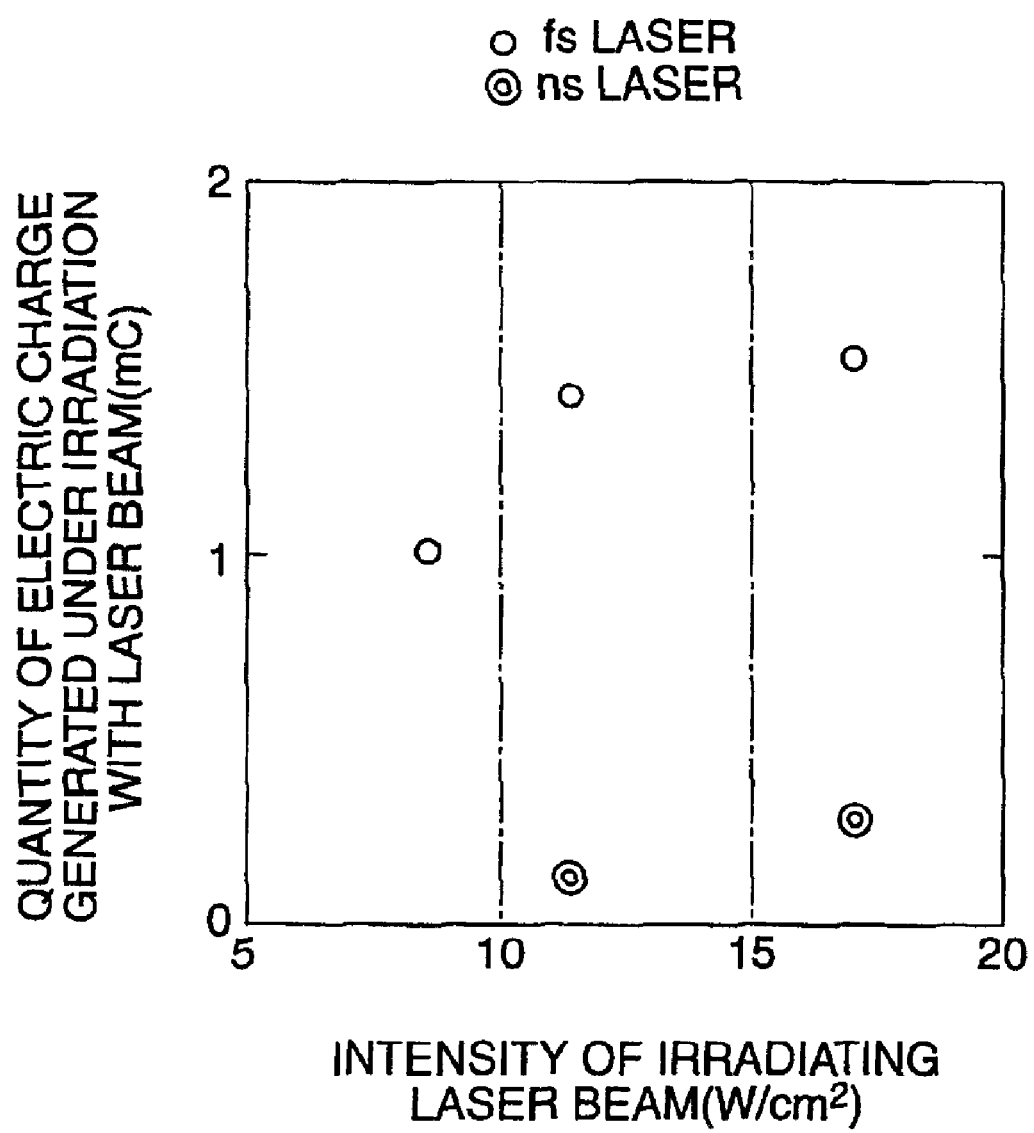
FIG. 5 illustrates an example of the dependence of the quantity of generated electric charge on the luminous intensity of the irradiating beam in the case of an aqueous solution of Zn.

FIG. 4 and FIG. 5 show variations in electric charge generated by the fs laser, the cw laser and the ns laser relative to the laser beam intensity. FIG. 4 illustrates a case in which an aqueous solution of Pt ($H_2PtCl_6$; 1 g/$(CH_3COO)_2Pb$; 10 mg/water 30cc) was used, and FIG. 5, a case in which an aqueous solution of Zn ($ZnCl_2$; 20 g/water 80cc) was used, both as the electrolyte solution 22.

The bias voltage between the electrode 23 and the opposite electrode 24 was −300 mV for the aqueous solution of Pt and −1.1 V for the aqueous solution of Zn. The electrode 23 was one of Au, and the opposite electrode 24, one of platinum black.

It is seen from these FIG. 4 and FIG. 5 that, whichever the electrolyte solution was, the electric charge generated under irradiation with the fs laser was four to ten times as much as that generated under irradiation with the cw laser or the ns laser. This reveals that electrons were more efficiently taken out when under irradiation with the fs laser than when under irradiation with either of the other lasers.

(Embodiment 2)

Figure 6:
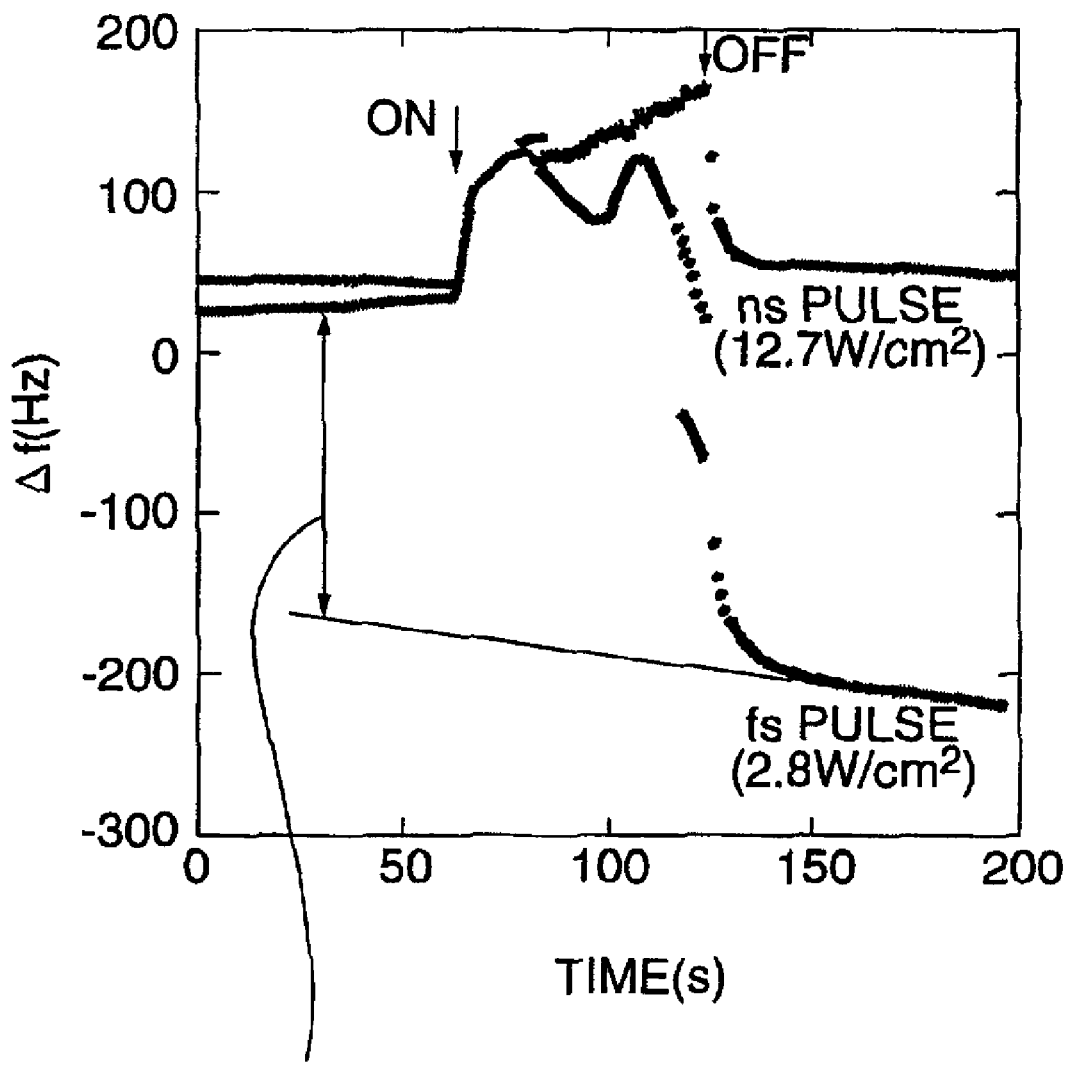
FIG. 6 illustrates the variation in electrode weight when plating is formed.

FIG. 6 shows variations in electrode weight when under irradiation with the fs laser (fs pulse in FIG. 6) and under irradiation with the ns laser (ns pulse in FIG. 6) In this case the irradiation intensity of the fs laser was 2.8 W/cm$^2$, and that of the ns laser was 12.7 W/cm$^2$. The electrolyte solution used in this case was $H_2PtCl_6$; 1 g/$(CH_3COO)_2Pb$; 10 mg/water 30 cc; the bias voltage was −300 mV, the electrode 23 was one of Au, and the opposite electrode 24 was one of platinum black. Variations in resonance frequency Δf in the negative direction matched increases in weight.

It is seen from this FIG. 6 that, while the electrode weight increased, i.e. plating was formed, when under irradiation with the fs laser, no plating was formed when under irradiation with the ns laser in spite of its more than four times as great luminous intensity than that of the fs laser. By direct visual observation, too, spotty formation of plating was witnessed when under irradiation with the fs laser but no plating formation was found when under irradiation with the ns laser.

The luminous intensity required for starting plating formation with the fs laser was 2.8 W/cm$^2$ and, as plating formation by the effect of thermo-electromotive force is reported to require a luminous intensity of 10$^2$ to 10$^6$ W/cm$^2$ (see References 1 and 2 cited above), this phenomenon seems attributable not to the thermo-electromotive force but to the hot electrons. Experiments by the present inventors also confirmed that no plating formation could be witnessed with a cw laser of the same output as the fs laser.

(Embodiment 3)

In addition to the foregoing, the following study was carried out to finally confirm that the phenomenon resulting from irradiation with the femtosecond laser in this mode of implementing the invention derives from hot electrons.

Figure 7:
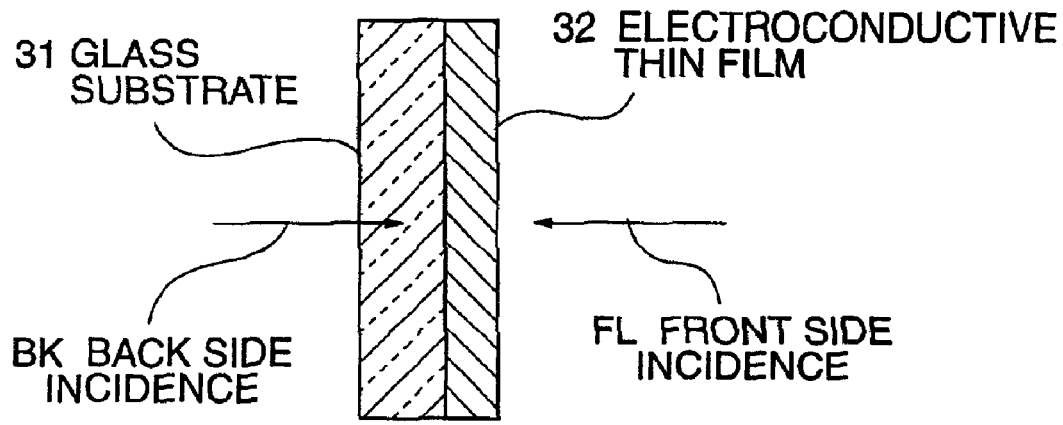
FIG. 7 illustrates the direction of laser beam incidence.

In plating formation by a thermo-electromotive force, the laser beam is absorbed by the substrate and generates an electromotive force. For this reason, as illustrated in FIG. 7, where the substrate 31 is made of a transparent material such as glass, plating is similarly formed irrespective of whether the laser beam comes incident on the front side of the thin-film electrode 32 formed by vapor deposition or otherwise as indicated by the arrow FL in the figure (hereinafter referred to as front side incidence) or it comes incident on the backside through the transparent substrate 31 as indicated by the arrow BK (hereinafter called the backside incidence). As a matter of fact, Reference 2 cited above gives a conclusion attributing the plating to a thermo-electromotive force on the ground that there is no difference in plating formation between front side incidence and backside incidence.

On the other hand, since hot electrons are generated only in a very thin area of metal surface irradiated with the laser beam as described above, if plating by the use of an femtosecond laser derived from hot electrons, incidence of the laser beam on the backside would not result in plating formation.

Figure 8:
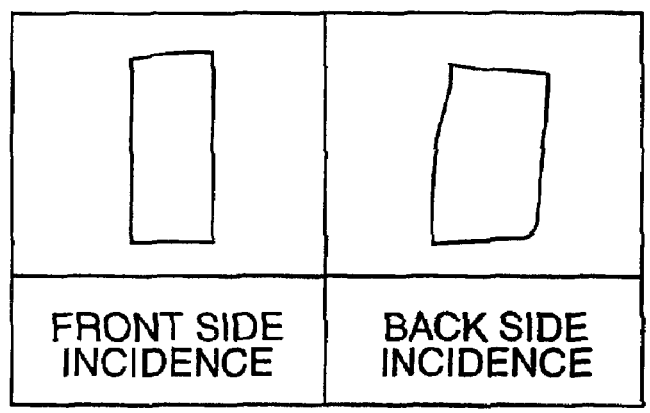
FIG. 8 illustrates the difference in plating formation with incidence side.

In view of this point, comparative tests on front side incidence and backside incident were carried out using the fs laser. These tests were conducted with an electrolyte solution of $NiSO_4$; 15 g/$NH_4Cl$; 1.5 g/$H_3BO_3$; 1.5 g/water 100 cc, a bias voltage of −600 mV, an electrode 23 made of Cu, and an opposite electrode 24 of platinum black. The results are shown in FIG. 8. It was confirmed that, where irradiation was conducted with the fs laser, spotty plating was formed only when the beam came incident on the front side, but no plating was formed by backside incidence.

The laser-irradiated parts of the surface were analyzed for both front side incidence and backside incidence by X-ray photo-electronic spectrometry (XPS), and the results tabulated in FIG. 9 were obtained. Ni components were observed only in the parts irradiated with the beam coming incident on the front side, and the spots were identified to be Ni plating. These findings endorsed that plating formation dependent on no thermal effect but utilizing hot electrons was being accomplished by the femtosecond laser.

The findings with these Embodiments 1 through 3 can be summarized as follows. The use of a femtosecond laser allows plating formation deriving from a surface reaction, differing from the previously reported effect of thermo-electromotive force. This plating reaction utilizing hot electrons is at least several times as efficient in energy utilization as plating reactions using the thermo-electromotive force of a continuous laser beam or a nanosecond laser.

(Embodiment 4)

Improvement in the aspect ratio resulting from the suppression of heat generation by irradiation with a femtosecond laser was examined.

In this instance, the composition of the electrolyte solution 22 used was $NiSO_4$; 15 g/$NH_4ClCl$; 1.5 g/$H_3BO_3$; 1.5 g/water 100 cc, the bias voltage, −400 mV, the material of the electrode 23, Cu, and that of the opposite electrode 24, platinum black. For comparison, a cw laser was used.

The fs laser was condensed to 5 W/cm$^2$, and the cw laser, to 10$^4$ W/cm$^2$ in intensity, and the plating formed in each instance was observed through an intermolecular force microscope (AFM). Examination of spots of 2 μm in height and 50 μm in diameter revealed that, while the aspect ratio in the end part was 1/1 where irradiation was accomplished with a cw laser, the aspect ratio under irradiation with an fs laser was improved to 3/1. This presumably is due to suppression of thermal diffusion by the use of the femtosecond laser.

Whereas the foregoing description referred to cases in which the femtosecond laser was used for metal-plating, irradiating the part to be etched with a femtosecond laser of a higher power than that used for plating would allow etching in a higher aspect ratio. During this etching process, no bias voltage is applied.

This way of etching using a laser beam is discussed in, for example, Reference 3: *Applied Physics A*-63, 109–115 (1996) and Reference 4: Obara et al., *Laser Engineering Optics* (in Japanese; Kyoritsu Shuppan, 1998). Reference 3 elaborates on the shapes of holes that are formed and the results of observation. Etching with this femtosecond laser was also studied with Embodiment 5 described below.

(Embodiment 5)

In this embodiment, etching was accomplished by condensing a femtosecond laser of 300 mW and a nanosecond laser of the same output on an Au electrode, formed by vapor deposition over a quartz oscillator, and variations in the Au electrode weight in each case were measured. The results are shown in FIG. 10.

Figure 10:
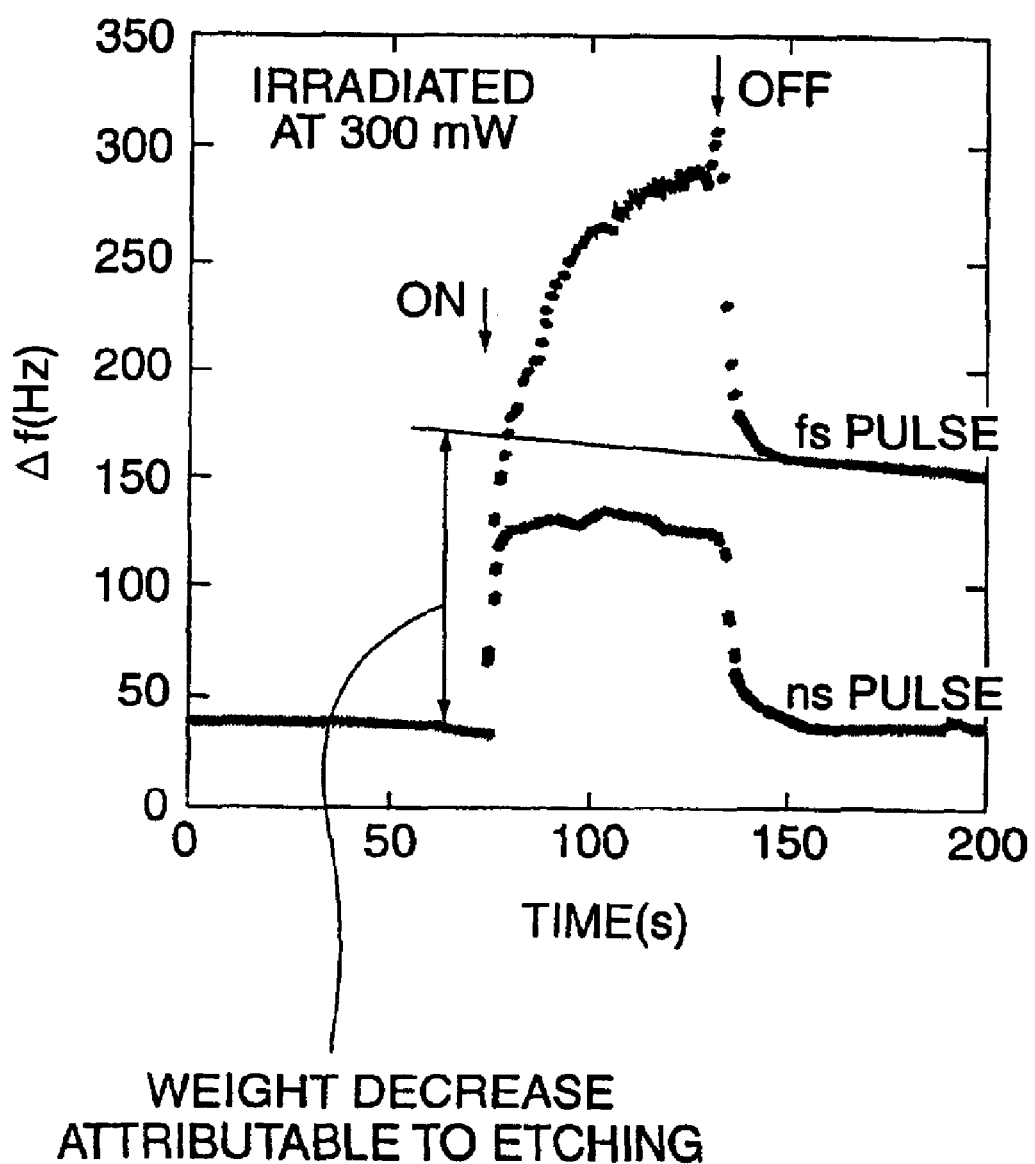
FIG. 10 illustrates the variation in electrode weight during etching by irradiation with a laser beam.
Figure 13:
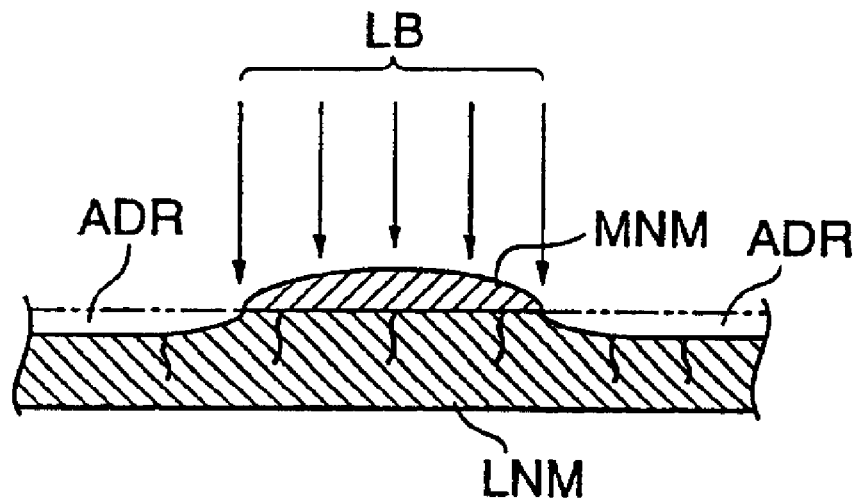
FIG. 13 illustrates an example of electrode formed by a plating method using laser beam irradiation according to the prior art.
Figure 14:
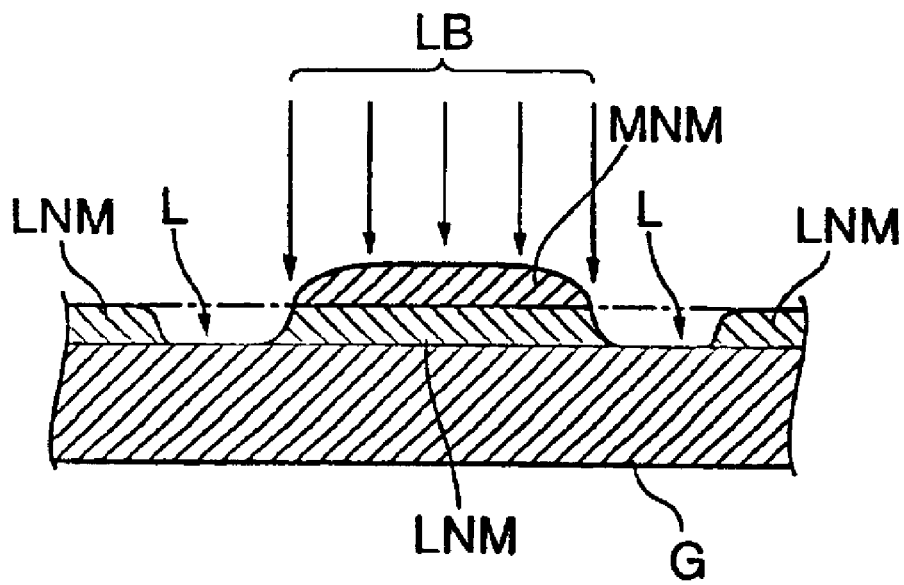
FIG. 14 illustrates another example of electrode formed by a plating method using laser beam irradiation according to the prior art.

This FIG. 10 reveals that the frequency increases, or the weight decreases owing to hole formation, only under irradiation with the femtosecond laser. The shapes of the holes that are formed have a high aspect ratio as noted in Reference 3 cited above.

As described above, this invention enables etching in a high aspect ratio and plating in a high aspect ratio to be accomplished using the same femtosecond laser. Accordingly, in this embodiment, previously difficult electrode machining can be carried out in addition to maskless patterning and electrode repairing. An example of this electrode machining will be described below with reference to FIGS. 11A to 11C and FIGS. 12A to 12D.

FIGS. 11A to 11C illustrate a process to form sharp-edged metal wiring over an insulator substrate.

First, as shown in FIG. 11A, a base electrode 42 of 10 to 100 nm in thickness is formed over the insulator substrate 41 by vacuum deposition or otherwise. Then, the substrate 41 over which this base electrode 42 is vacuum-deposited is soaked in the electrolyte solution 22 of the plating bath 21 of the plating apparatus illustrated in FIG. 3. Then this base electrode 42 serves as the electrode 23 of FIG. 3.

Next, a bias voltage is applied between the electrode 23, i.e. the base electrode 42, and the opposite electrode 24; the surface of the base electrode 42 is irradiated with a femtosecond laser to accomplish metal-plating; and an electrode pattern 43 is formed as illustrated in FIG. 11B.

When this electrode pattern 43 has reached a desired thickness for electrode wiring (several $\mu$m), plating is completed. Then, as illustrated in FIG. 11C, the whole area is uniformly etched to remove the base electrode 42 over the insulator substrate 41 to leave only the electrode pattern 43.

This etching may be carried out either by laser irradiation or physicochemically. In the case of laser irradiation, a nanosecond laser may be used, but the use of a femtosecond laser would result in more precise etching around the edges of the electrode pattern 43 as well.

This process illustrated in FIGS. 11A to 11C represents a significant simplification over masked exposure using a resist, and provides fine electric wiring of high quality having a high aspect ratio. If etching is also accomplished using the femtosecond laser, a serial process can be efficiently accomplished without having to replace the laser.

Next, FIGS. 12A to 12D illustrate a three-dimensional electrode machining process using a femtosecond laser.

First, as shown in FIG. 12A, an insulator film 52 is formed over a necessary part of an electrode 51 formed over an insulator substrate (not shown). Then the position of a fine electrode to be formed over the insulator film 52 is irradiated with a femtosecond laser, and a throughhole 53 is formed in the insulator film 52 as illustrated in FIG. 12B. This etching process is carried in a state in which the substrate, which is the object to be treated, soaked in the electrolyte solution 22 of the plating bath 21 of the plating apparatus shown in FIG. 3.

Next, with the underlying electrode 51 serving as the electrode 23 of FIG. 3, a bias voltage is applied between this electrode 51 and the opposite electrode 24; the part of the throughhole 53 is irradiated with a femtosecond laser to carry out local metal-plating; and an electrode pattern 54 is formed as illustrated in FIG. 12C.

This electrode pattern 54 formed by plating through irradiation with a femtosecond laser has a high aspect ratio, having a precisely formed throughhole 53 with a high aspect ratio as illustrated in FIG. 12C but without expansion of the electrode in an overhung shape.

As a comparative example, the throughhole 53 was irradiated with a continuous laser beam and the electrode was plated. In this instance, as illustrated in FIG. 12D, the electrode pattern 54 was expanded by thermal diffusion. Or where usual electric field plating was carried out, the electric field rolled in to expand the electrode pattern similarly, making it impossible to form an electrode whose expansion was suppressed by a femtosecond laser.

Although the above-described embodiment represents a case in which this invention is applied to electrode formation by a femtosecond laser, methods for electrodeposited film formation according to the invention are not limited in applicability to electrodeposited film formation by plating. For instance, it can be applied as well to electrochemical formation of a dye film over the surface of the object to be treated, with an aqueous solution of the dye being used as the electrolyte solution.

As hitherto described, this invention can provide electrode machining techniques permitting efficient accomplishment, by the use of a femtosecond laser, of maskless patterning, electrode repairing, fine electrode formation and fabrication of a three-dimensional electric circuit with reduced energy consumption and high product quality.

What is claimed is:

1. An apparatus for electrodeposited film formation comprising:

an electrolyte solution bath holding: (a) an electrolyte solution containing ions to constitute an electrodeposited film and (b) an object to be treated of which at least the surface permits generation of charged particles when irradiated with a laser beam and onto which the electrodeposited film is to be deposited; and a mode-locked laser whose pulse width is less than a picosecond and which irradiates at least part of the object to be treated positioned in the electrolyte solution to thereby generate hot electrons in the laser-irradiated part and form the electrodeposited film at the laser-irradiated part.

2. An apparatus for electrodeposited film formation, according to claim 1, further provided with:

an opposite electrode held separated from the object to be treated in the electrolyte solution; and a power source for applying a bias voltage between the object to be treated and the opposite electrode.

3. The apparatus according to claim 1, wherein said electrolyte solution contains at least one plating metal selected from the group consisting of Cu, Pt, Zn, Ni, Cd, Cr, Sn, Au, Ag, Rh, Ru, Pb, Ti, Pd, Co, B, Ge, Al, In, Ir, Mo, W, V and Ta.

4. The apparatus according to claim 3, wherein said electrolyte solution contains at least one of Cu, Pt, Zn or Ni.

5. The apparatus according to claim 1, wherein the object to be treated comprises a metal selected from the group consisting of Au, Cu, Pt, Zn, Cd, CrSnAu, AgRh, Ru, Pb, TiPd, Co, B, Ge, Al, In, Ir, Mo, W, V, Ta, Ni, Sn and alloys thereof.

6. The apparatus according to claim 1, wherein the object to be treated comprises at least one of Au, Cu, Pt or Zn.

7. The apparatus according to claim 1, wherein said electrolyte solution is an aqueous solution.

8. The apparatus according to claim 7, wherein said aqueous solution contains 2 to 18% by weight plating metal.

9. The apparatus according to claim 1, wherein said mode-locked laser is a mode-locked titanium sapphire laser.

10. An apparatus for electrodeposited film formation comprising:

an electrolyte solution bath holding: (a) an electrolyte solution containing ions to constitute an electrodeposited film and (b) an object to be treated of which at least the surface permits generation of charged particles when irradiated with a laser beam and onto which the electrodeposited film is to be deposited; and a pulse laser with an electric field in the order of tens of $GW/cm^2$ and whose pulse width is less than a picosecond and which irradiates at least part of the object to be treated positioned in the electrolyte solution to thereby generate hot electrons in the laser-irradiated part and form the electrodeposited film at the laser-irradiated part.

11. An apparatus for electrodeposited fun formation, according to claim 10, further provided with:

an opposite electrode held separated from the object to be treated in the electrolyte solution; and a power source for applying a bias voltage between the object to be treated and the opposite electrode.

12. The apparatus according to claim 10, wherein said electrolyte solution contains at least one plating metal selected from the group consisting of Cu, Pt, Zn, Ni, Cd, Cr, Sn, Au, Ag, Rh, Ru, Pb, Ti, Pd, Co, B, Ge, Al, In, Ir, Mo, W, V and Ta.

13. The apparatus according to claim 12, wherein said electrolyte solution contains at least one of Cu, Pt, Zn or Ni.

14. The apparatus according to claim 10, wherein the object to be treated comprises a metal selected from the group consisting of Au, Cu, Pt, Zn, Cd, CrSnAu, AgRh, Ru, Pb, TiPd, Co, B, Ge, Al, In, Ir, Mo, W, V, Ta, Ni, Sn and alloys thereof.

15. The apparatus according to claim 10, wherein the object to be treated comprises at least one of Au, Cu, Pt or Zn.

16. The apparatus according to claim 10, wherein said electrolyte solution is an aqueous solution.

17. The apparatus according to claim 16, wherein said aqueous solution contains 2 to 18% by weight plating metal.

* * * * *